United States Patent
He

(10) Patent No.: US 11,894,416 B2
(45) Date of Patent: Feb. 6, 2024

(54) DISPLAY DEVICES WITH MULTIPLE EMITTERS

(71) Applicant: Google LLC, Mountain View, CA (US)

(72) Inventor: Gang He, Cupertino, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/858,783

(22) Filed: Jul. 6, 2022

(65) Prior Publication Data

US 2022/0352253 A1 Nov. 3, 2022

Related U.S. Application Data

(62) Division of application No. 17/173,168, filed on Feb. 10, 2021, now abandoned.

(60) Provisional application No. 62/972,206, filed on Feb. 10, 2020.

(51) Int. Cl.
*H01L 27/15* (2006.01)

(52) U.S. Cl.
CPC .................. *H01L 27/156* (2013.01)

(58) Field of Classification Search
CPC ..... H01L 27/153; H01L 33/24; H01L 27/156; H01L 33/08; H01L 33/14
See application file for complete search history.

(56) References Cited

U.S. PATENT DOCUMENTS

| 2009/0078955 A1* | 3/2009 | Fan | H01L 27/15 438/46 |
| 2016/0181476 A1* | 6/2016 | Chang | H01L 33/06 257/13 |
| 2020/0411720 A1* | 12/2020 | Wildeson | H01L 27/153 |

FOREIGN PATENT DOCUMENTS

| JP | 2010166036 A | 7/2010 |
| JP | 2014241397 A | 12/2014 |
| JP | 2017028287 A | 2/2017 |
| JP | 2018521516 A | 8/2018 |
| KR | 20170129009 A | 11/2017 |
| WO | 2019126728 A1 | 6/2019 |
| WO | 2019135606 A1 | 7/2019 |

* cited by examiner

*Primary Examiner* — Changhyun Yi
(74) *Attorney, Agent, or Firm* — Brake Hughes Bellermann LLP

(57) ABSTRACT

A display device includes a substrate includes a first emitter and a second emitter thereon. The first emitter includes a first lower active quantum well (QW) region that has a first emission spectrum spanning a first spectral range. The second emitter includes (i) an upper active QW region that has a second emission spectrum spanning a second spectral range that is distinct from the first spectral range, (ii) a second lower active QW region having the first emission spectrum and being located between the upper active QW region and the substrate, and (iii) a barrier layer between the second lower active QW region and the upper active QW region for suppressing emission of the second lower active QW region.

24 Claims, 11 Drawing Sheets

DISPLAY DEVICES WITH MULTIPLE EMITTERS

CROSS-REFERENCE TO RELATED APPLICATION

This application is a divisional application of U.S. patent application Ser. No. 17/173,168 filed Feb. 10, 2021, which benefits from and claims priority to U.S. Provisional Patent Application Ser. No. 62/972,206, filed on Feb. 10, 2020, the disclosures of which are incorporated herein by reference in their entirety.

BACKGROUND

Aspects of the present disclosure generally relate to light emitting devices that may be used in connection with various types of displays, and more specifically, to monolithic multi-color light-emitting diodes (LEDs).

As the number of light emitting elements (e.g., pixels) used in displays continues to increase to provide better user experience and to enable new applications, adding more and more of them becomes a challenge from both a design and manufacturing perspective. To achieve ever smaller light emitting elements in order to increase both count and density has made the potential use of small LEDs more attractive; however, effective and efficient techniques for making small LEDs in large numbers, high densities, and capable of producing the different colors (e.g., red, green, blue) needed for a color display are not widely available, and those that do exist tend to be cumbersome, time consuming, and costly. In addition, making use of these small LEDs in more sophisticated display architectures with more stringent requirements in terms of both performance and size, such as light field displays and micro-displays, becomes a rather difficult thing to do.

Accordingly, techniques and devices that enable effective and efficient design and fabrication of large numbers of multi-color LEDs are desirable.

SUMMARY OF THE EMBODIMENTS

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In a first aspect, a display device includes a substrate includes a first emitter and a second emitter thereon. The first emitter includes a first lower active quantum well (QW) region that has a first emission spectrum spanning a first spectral range. The second emitter includes (i) an upper active QW region that has a second emission spectrum spanning a second spectral range that is distinct from the first spectral range, (ii) a second lower active QW region having the first emission spectrum and being located between the upper active QW region and the substrate, and (iii) a barrier layer between the second lower active QW region and the upper active QW region for suppressing emission of the second lower active QW region.

In a second aspect, a method for forming a plurality of light emitters includes the following enumerated steps (i)-(vii). Step (i) includes forming a first recess on a substrate, the first recess having a first width and a first depth. Step (ii) includes forming a second recess on the substrate, the second recess having a second width and a second depth, at least one of the second width and the second depth being larger than the first width and first depth, respectively. Step (iii) includes depositing a first n-type barrier material on the substrate. Step (iv) includes fabricating a first active quantum well (QW) structure on the first n-type barrier material. Step (v) includes depositing a second n-type barrier material on the first active QW structure; Step (vi) includes fabricating a second active QW structure on the second n-type barrier material. Step (vii) includes depositing a third n-type barrier material on the second active QW structure. The first width and first depth of the first recess are configured to prevent formation of the second active QW structure within the first recess such that the first n-type barrier material, the first active QW structure, and the second n-type barrier layer form a first light emitter. The second width and second depth of the second recess are configured for supporting the first n-type barrier material, the first active QW structure, the second n-type barrier material, the second active QW structure, and the third n-type barrier material within, and at least partially contained within, the second recess to form a second light emitter

BRIEF DESCRIPTION OF THE FIGURES

The appended drawings illustrate only some implementation and are therefore not to be considered limiting of scope.

FIGS. 5, 6, and 7 illustrate an example of single continuous SAG with etch isolation, in accordance with aspects of this disclosure.

DETAILED DESCRIPTION OF THE EMBODIMENTS

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

In view of the issues presented above, the use of single-epitaxy (e.g., single epitaxial growth pass) multi-color LED arrays are highly desirable since many applications, including but not limited to displays, need emitters of multiple colors. Hybrid assembly of multiple arrays of different colors is expensive and limited in density while monolithic fabrication that uses different epitaxial passes could be expensive. To address these issues, the present disclosure describes multi-color LED arrays that can be achieved in a single epitaxy step (or in a limited number of epitaxy steps) by taking advantage of facet-dependent epitaxial growth. P-facet growth can be almost fully suppressed while c-facets grow under certain growth conditions. P-facet growth may be enabled under other growth conditions. P-facet may be used to terminate growth by forming pyramids whose heights and layers depend on the size of the device growth area.

That is, the present disclosure proposes to take advantage of the facets that occur during epitaxial growth. As mentioned above, when growing epitaxy with a selected area method (e.g., when using a selective area growth (SAG) mask), the epitaxy will grow in facets and the idea is to take advantage of the facet-based growth to limit certain structures (e.g., LEDs) to only grow the quantum wells of that are desirable to produce the light color associated with that structure. Thus, the present disclosure describes the use of the facet-dependent growth properties of selective area growth to self-terminate certain pixels when growing an epitaxial structure such that different pixels terminate at different portions of the growth and the pixels include only those quantum wells needed to produce the appropriate color of light.

Figure 1:
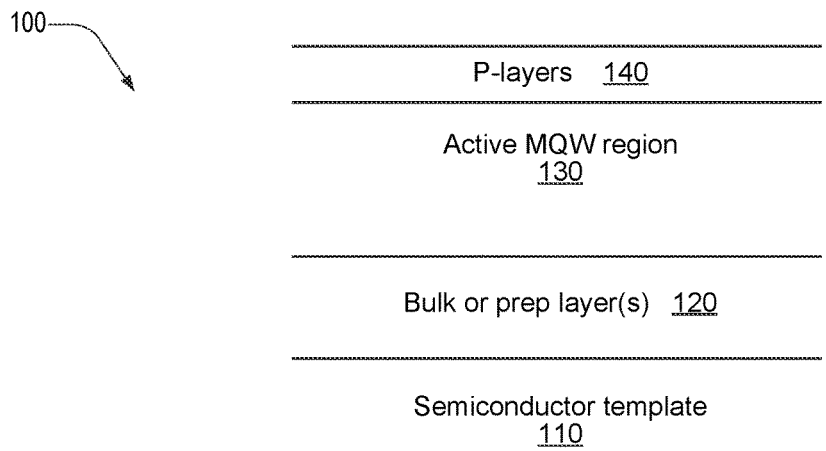
FIG. 1 illustrates a commonly implemented microLED structure.

FIG. 1 is a cross-sectional schematic of a portion of an LED structure 100 that includes a semiconductor substrate or template 110 supporting one or more bulk or prep layers 120. An active quantum well (QW) region 130 is formed on bulk or prep layers 120. Bulk or prep layers 120 is, for example, a thick layer of a material or a structure of two or more materials configured for providing reduced effect of a lattice mismatch and/or thermal expansion coefficient mismatch and/or filtering of defects from semiconductor template 110 to active QW region 130. In embodiments, active QW region includes multiple quantum wells.

By adjusting the material composition of bulk or prep layers 120, more flexibility in the material selection for active QW region 130 can be obtained, thus enabling the formation of an active region with desired light emission characteristics. Finally, one or more p-layers 140 are deposited on active QWs for forming a p-n diode and providing electronic contact to LED structure 100. P-layers 140 include p-doped layers and/or a contact layer. LED structure 100 can then be etched or otherwise shaped to form the desired microLED form factor for a designated application.

Figure 2:
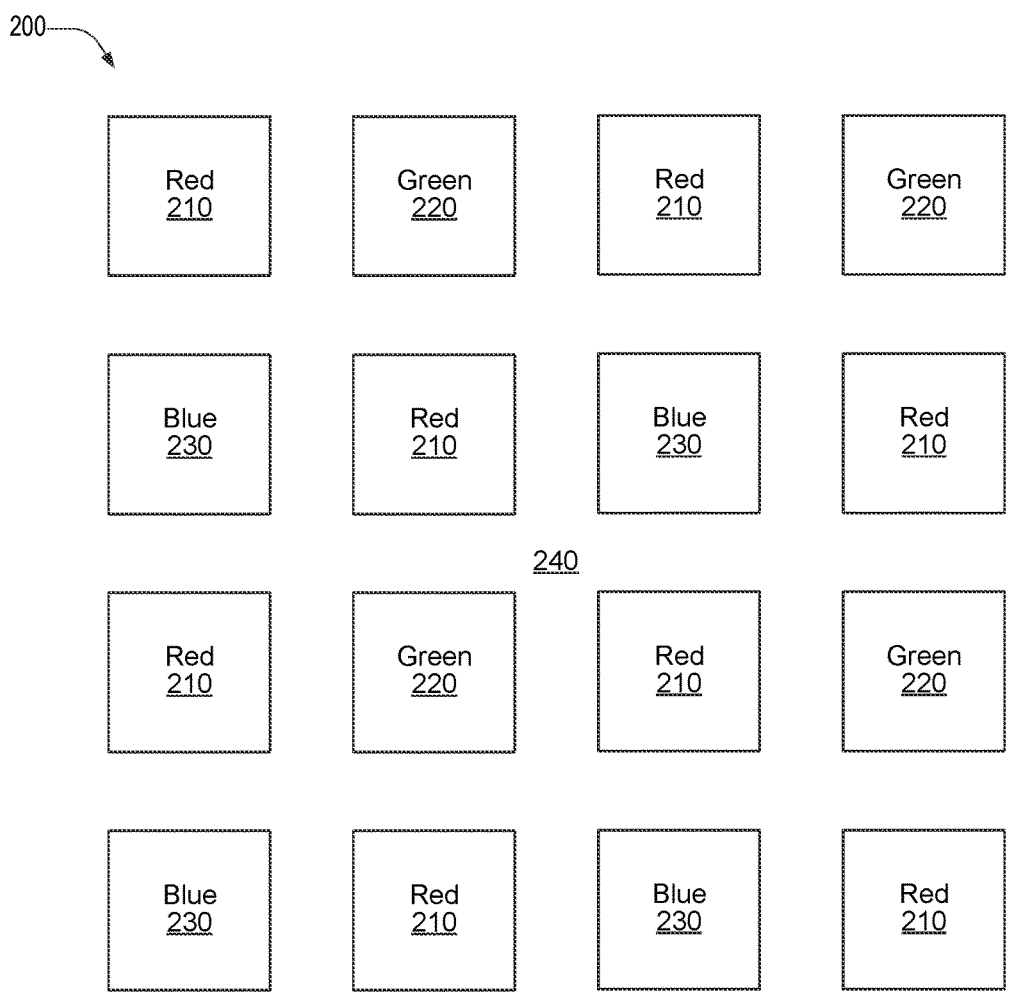
FIG. 2 illustrates a top view of multiple microLED structures as part of an array for use in a display, in accordance with aspects of this disclosure.

FIG. 2 is a plan view of a portion of an LED array 200 including multiple microLED structures as part of an array for use in a display, in accordance with aspects of this disclosure. As shown in FIG. 2, LED array 200 includes a plurality of microLED structures 210, 220, and 230 supported on a substrate 240 and, as an example, emitting at red, green, and blue wavelengths, respectively. Each of microLED structures 210, 220, and 230 is an example of LED structure 100. While only a 4-by-4 array of LEDs is shown in FIG. 2, LED array 200 may be part of a larger array of emitters forming, for instance, a display, and the arrangement of the pixels, their shapes, their numbers, their sizes, and their corresponding wavelength emissions can be adjusted for specific applications. The display can be a high resolution, high density display, such as those used in light field applications.

In particular, in order to achieve a high density of emitters or an array of a specified number of emitters in close proximity to each other, it may be desirable to be able to form microLED structures 210, 220, and 230 on the same substrate in a monolithically integrated manner. That is, rather than forming each type of microLED structure on a separate substrate (e.g., one or more red-emitting microLEDs on a first substrate, one or more green-emitting microLEDs on a second substrate, and one or more blue-emitting microLEDs on a third substrate), then transferring each microLED to a fourth substrate to form the microLED array to be used as a display, an array of all three types of microLEDs are directly formed on a single substrate. In other words, rather than forming each color of microLEDs 210, 220, and 230 on separate wafers and transferring each LED to another substrate to form LED array 200 as shown in FIG. 2, a higher density LED array can be achieved by forming microLED structures 210, 220, and/or 230 on a single substrate from the start.

Figure 3:
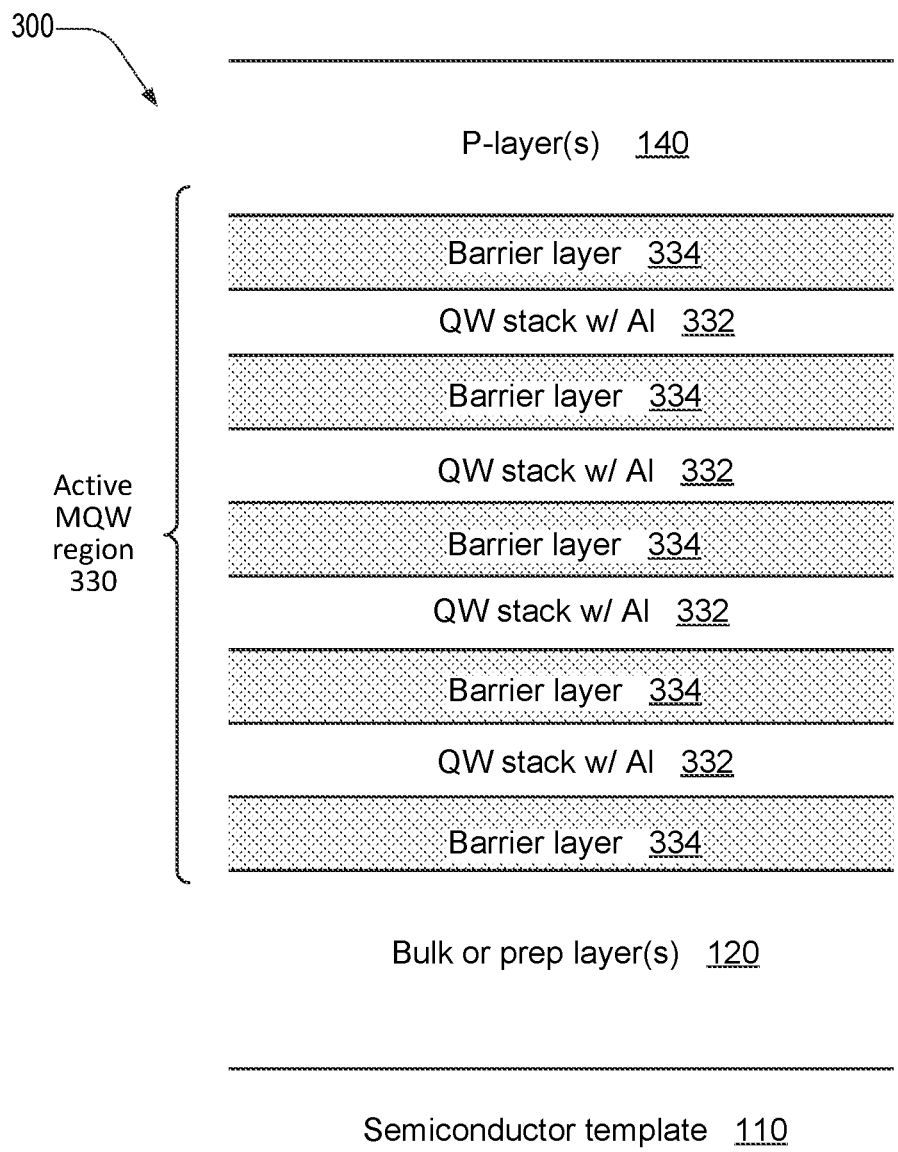
FIG. 3 illustrates an example of a microLED structure including an active multiple quantum well (MQW) region, in accordance aspects of this disclosure.

FIG. 3 is a cross-sectional schematic of a microLED structure 300 that includes an active MQW region 330. MicroLED structure 300 that includes active MQW region 330 are respective examples of LED structure 100 and active MQW region 130. MicroLED structure 300 includes an active MQW region 330, including an active QW region 332 separated by barrier layers 334 (e.g., GaN or InGaN barrier layers). Each active QW region 332 may include a single layer of material, or two or more layers of different materials. While four sets of repeated stacks of active QW region 332 and barrier layer 334 are shown within active MQW region 330, fewer or greater number of stacks can be included, depending on the desired light emission performance.

Figure 4:
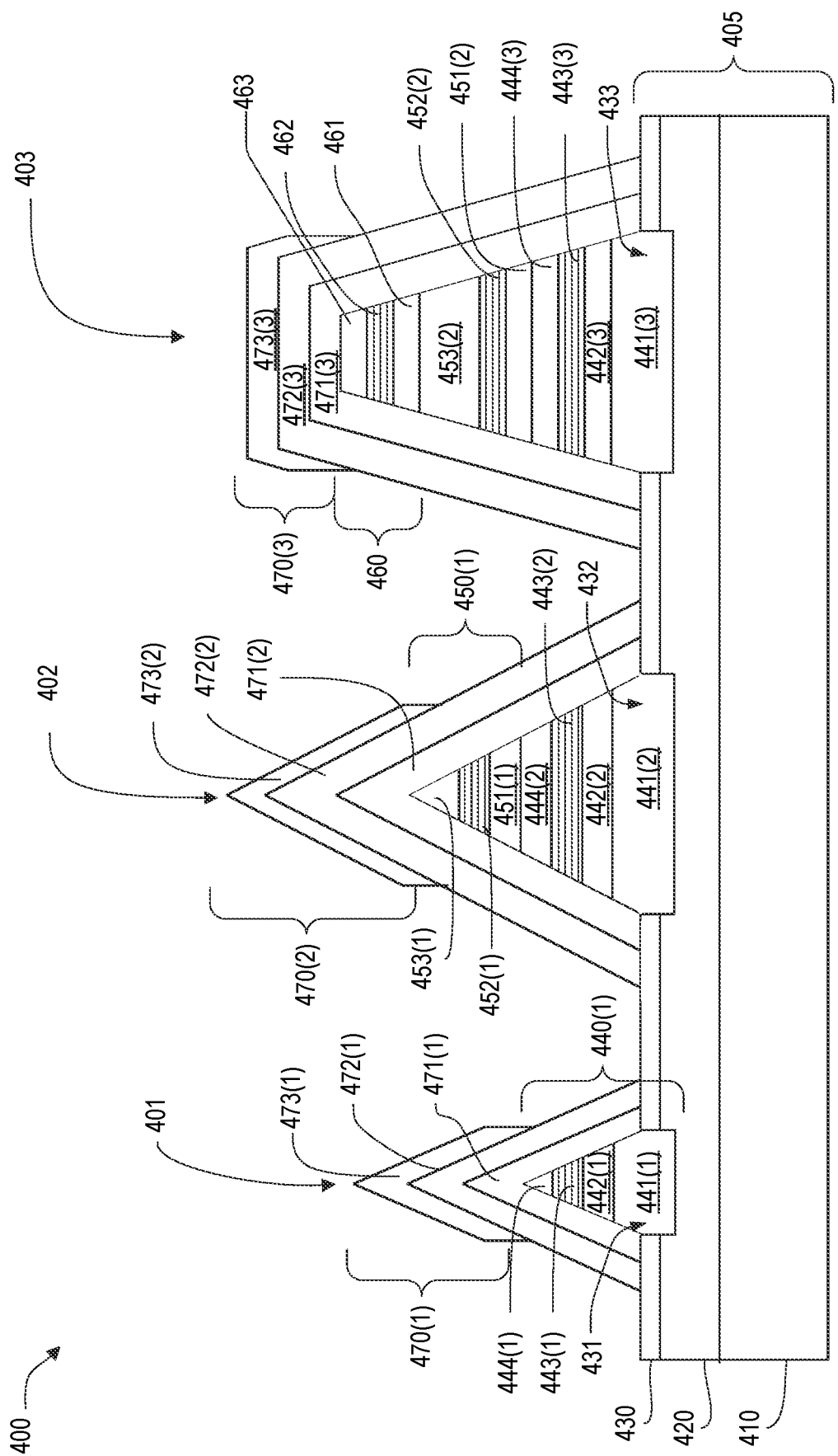
FIG. 4 illustrates an example of LED color selection by selective area growth (SAG) opening width, in accordance with aspects of this disclosure.

FIG. 4 is a cross-sectional schematic of a display device 400, which is an example of LED color selection by selective area growth (SAG) opening width, in accordance with aspects of this disclosure. Display device 400 includes a substrate 405 with emitters 401 and 402 supported thereon. In embodiments, display device 400 also includes an emitter 403. Emitter 401 includes a first type of LED that produces illumination in a first spectral range (e.g., blue light). Emitter 402 includes a second type of LED that produces illumination in a second spectral range (e.g., green light). Emitter 403 includes a third type of LED that produces illumination in a third spectral range (e.g., red light).

In embodiments, emitters 401, 402, and 403 are epitaxially grown using a single epitaxial growth pass. Emitters 401, 402, and 403 are grown by defining openings using a SAG mask 430 that is placed over substrate 405, which may be for example a semiconductor wafer or another substrate compatible with LED fabrication processes. SAG mask 430 includes apertures 431 and 432. Herein the terms opening and aperture within a SAG mask are used interchangeably. In embodiments, SAG mask 430 also includes an aperture 433, in which case display device also includes emitter 403.

Substrate 405 includes a buffer layer 410 and may also include a hole blocking layer (HBL) 420, each of which may be formed of n-type semiconductor materials. In embodiments, hole blocking layer 420 is formed of AlGaInN. Hole blocking layer 420 functions to reduce the amount of crosstalk that can occur between active QW regions.

In embodiments, the epitaxial growth includes deposition of a barrier layer 441, an active QW region 443, a barrier layer 444, an active QW region 452, and a barrier layer 453. In embodiments, the epitaxial growth also includes deposition of at least one of a hole blocking layers 442 and 451. When display device 400 includes emitter 403, the epitaxial growth includes deposition of an active QW region 462 and barrier layer 463. In embodiments, the epitaxial growth also includes deposition of a hole blocking layer 461. At least one of layers 441, 442, 444, 451, and 461 may be formed of an n-type semiconductor. In some implementations, an n-type barrier may be disposed between the optional n-type hole blocking layer and any of the quantum wells.

In an embodiment, SAG mask 430 prevents accumulation of deposited material between adjacent emitters, such that the above-mentioned epitaxial deposition adheres only to regions of substrate 405 exposed by apertures of SAG mask 430, such as apertures 431-433. As such, deposition of layers 441, 442, active QW region 443, and layer 444 results in respective layers 441(1,2,3)-444(1,2,3) within or aligned with apertures 431-433, as illustrated in FIG. 4. Also, deposition of layer 451, active QW region 452, and layer 453 results in respective layers 451(1,2)-453(1,2) within or aligned with apertures 432 and 433, as illustrated in FIG. 4. Each of layers 461-463 is part of emitter 403 only, as at this state in deposition—after deposition of barrier layer 453, each of emitters 401 and 402 is too narrow to support adhesion of any additional layer.

In embodiments, the epitaxial growth also includes deposition of a p-type electron blocking layer 471, a p-type layer 472, and an ohmic contact layer 473. Layers 471(1,2,3) are respective sections of layer 471; layers 472(1,2,3) are respective sections of layer 472; and layers 471(1,2,3) are respective sections of layer 473. In embodiments, at least one of (i) emitters 401-403 includes respective layers 471(1)-471(3); (ii) emitters 401-403 includes respective layers 472(1)-472(3); and (iii) emitters 401-403 includes respective layers 473(1)-473(3).

Emitter 402 includes n-type barrier layer 441(2), hole blocking layer 442(2) (in certain embodiments), active QW region 443(2), n-type barrier layer 444(2), hole blocking layer 451(1) (in certain embodiments), active QW region 452(1), and barrier layer 453(1) before the structure terminates. In emitter 402, n-type barrier layer 444(2) prevents current flow across active QW region 443(2), hence suppressing light emission therefrom.

In embodiments, active QW regions 443 and 452 are formed in a single epitaxial growth pass, such that respective lattice parameters, (e.g., lattice constants and/or lattice angles) of materials and layers constituting QW regions 443 and 452 are similar. In embodiments, corresponding lattice constants and/or lattice angles of materials constituting active QW regions 443 and 452 differ by less than five percent.

Active QW regions 130 and 330 are examples of both active QW regions 443(1-3) and active QW region 452(1,2). QW region 443 has an emission spectrum spanning a first spectral range. QW region 452 has an emission spectrum spanning a second spectral range, that, in embodiments, differs from the first spectral range of QW region 443. In embodiments, each of the first and second spectral ranges is one of the red, green, and blue regions of the visible electromagnetic spectrum while also being different regions, such that together the first and second spectral ranges span two of the red, green, and blue regions.

Emitter 403 includes n-type barrier layer 441(3), hole blocking layer 442(3) (in certain embodiments), active QW region 443(3), n-type barrier layer 444(3), hole blocking layer 451(2) (in certain embodiments), active QW region 452(2), barrier layer 453(2), hole blocking layer 461, active QW region 462, and n barrier layer 463 before the structure terminates. In emitter 403, n-type barrier layer 444(3) prevents current flow across active QW region 443(3), and hence suppressing light emission therefrom. Similarly, n-type barrier layer 453(2) prevents current flow across active QW region 452(2), and hence suppressing light emission therefrom.

Active QW regions 130 and 330 are example of both active QW region 462, which as has an emission spectrum spanning a third spectral range that may differ from each of the first and second spectral ranges of active QW regions 443(1-3) and 451(1,2). In embodiments, the first spectral range includes a blue region of the electromagnetic spectrum, the second spectral range includes a green region of the electromagnetic spectrum, and the third spectral range includes a red region of the electromagnetic spectrum. Other combinations of emission spectra are possible.

The complete epitaxial growth is reflected in the structure of the emitter 403, which does not terminate before growth of active QW regions 443, 452, and 461. In contrast, the structure of emitter 402 terminates (e.g., due to faceted growth mechanism of the various layers) before active QW region 462 is grown. Similarly, the structure of the emitter 401 terminates before both of active QW regions 452 and 461 is grown.

In embodiments, emitter 401 includes at least one of p-type electron blocking layer 471(1), p-type contact layer 472(1) and a metal (ohmic) contact layer 473(1), which are respective sections of layers 471-473 that remain after deposition. In embodiments, emitter 402 includes at least one of p-type electron blocking layer 471(2), p-type contact layer 472(2) and a metal (ohmic) contact layer 473(2). In embodiments, emitter 403 includes at least one of p-type electron blocking layer 471(3), p-type contact layer 472(3) and a metal (ohmic) contact layer 473(3). In embodiments, at least one of p-type layers 471 and 472 is partially or fully removed except for under the p ohmic contact layer 473.

FIG. 4 denotes layer groups 440(1-3), 450(1,2), 460, and 470(1-3). Layer group 440(1-3) includes respective layers 441(1-3), 443(1-3), 444(1-3), and in embodiments, layers 442(1-3). For example, layer group 440(1) includes layers 441(1), 443(1), 444(1), and in embodiments, layer 442(1). FIG. 4 denotes layer groups 440(1-3), which includes respective layers 441(1-3), 443(1-3), 444(1-3), and in embodiments, layer 442(1-3). Layer group 450(1) includes respective active layers 452(1), 453(1), 454(1), and in embodiments, layer 451(1). Layer group 450(2) includes respective active layers 452(2), 453(2), 454(2), and in embodiments, layer 451(2). Layer group 460 includes active active QW region 462 and layer 463, and in embodiments, hole blocking layer 461.

As illustrated by display device 400, the SAG mask provides openings of different sizes for the different types of LEDs. In this example, there is a narrow opening (e.g., for the blue LED), a wider opening (e.g., for the green LED), and the widest opening (e.g., for the red LED). The epitaxial layers of the epitaxial growth process are grown in the SAG mask's openings. In embodiments, SAG mask 430 is formed of $SiO_2$ or $Si_3N_4$.

When the opening is small, as is the case emitter 401 in this example, because of the facet angle associated with the epitaxial growth, the area of the growth shrinks as the growth progresses until reaching a termination point after active QW region 443(1) is grown but before part of active QW region 452 is grown thereon.

By making aperture 432 larger than aperture 431, as is the case for emitter 402 in this example, the growth termination point occurs after both active QW region 443(2) and the active QW region 452(1) are grown. Moreover, making aperture 433 larger than aperture 432, as is the case for emitter 403, the growth termination point occurs after all three active quantum well regions are grown, that is, active QW regions 443(3), 451(2), and 462.

This way it is possible to have three different structures, emitters 401-403 for example, each having a different respective active QW region: active QW regions 443(1), 451(1), and 462 respectively. Once the structures are formed it is possible to then grow the p-type contact layers 472 over all of the structures followed by placing ohmic contact layers 473. Emitters 401-403, which may be formed by using a single epitaxial growth pass, are therefore configured to emit light in three different spectral regions, e.g., blue, green, and red wavelengths.

Figure 5:
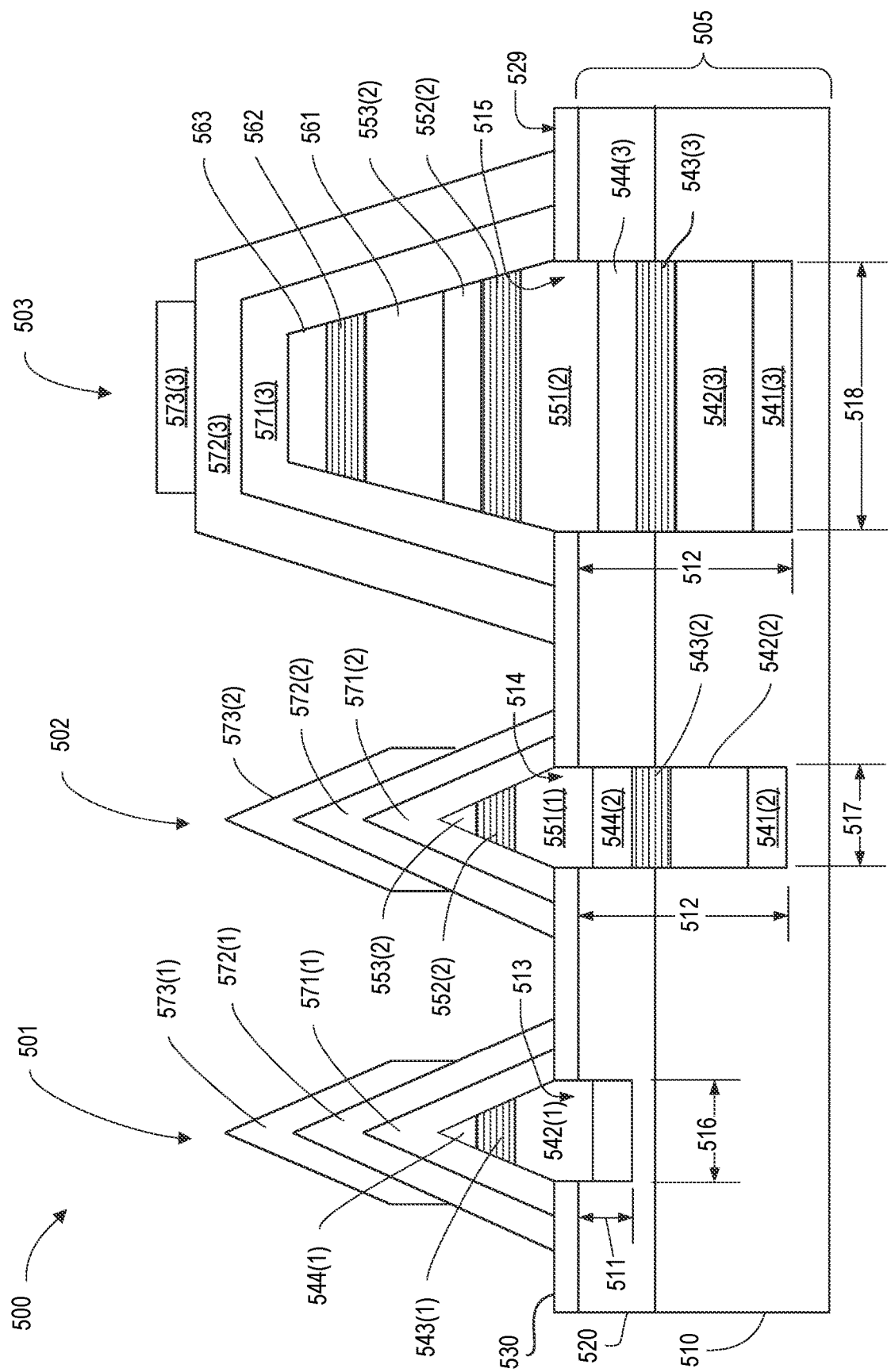
FIG. 5 illustrates an example of LED color selection by SAG opening width and depth, in accordance with aspects of this disclosure.

FIG. 5 is a cross-sectional schematic of a display device 500, which is an example of display device 400 in which LED color selection is achieved by controlling the SAG aperture width and depth of recesses within the substrate beneath each aperture. Display device 500 includes a substrate 505 and emitters 501 and 502 thereon. In embodiments, display device 500 also includes an emitter 503. Substrate 505 is an example of substrate 405, and includes a buffer layer 510, and in embodiments, a hole blocking layer 520 thereon. Buffer layer 510, hole blocking layer 520 are respective examples of buffer layer 410, hole blocking layer 420. Emitters 501-503 are respective examples of emitters 401-403. FIG. 5 includes a SAG mask 530 on substrate 505. SAG mask 530 is an example of SAG mask 430, and may be used in a selective aperture etching process to fabricate display device 500.

Emitter 501 includes layers 541(1), 543(1), and 544(1), which are respective examples of layers 441(1), 443(1), and 444(1) of emitter 401. In embodiments, emitter 501 also includes at least one of layers 571(1)-573(1), which are respective examples of layers 471(1)-473(1), FIG. 4. Emitter 502 includes layers 541(2), 543(2), 544(2), 552(1), and 553(1) which are respective examples of layers 441(2), 443(2), 444(2), 452(1), and 453(1) of emitter 402. In embodiments, emitter 502 also includes at least one of layers 571(2)-573(2), which are respective examples of layers 471(2)-473(2), FIG. 4. Emitter 503 includes layers 541(3), 543(3), 544(3), 552(2), 553(2), 562, and 563, which are respective examples of layers 441(3), 443(3), 444(3), 452 (3), and 453(3), 462, and 463 of emitter 403. In embodiments, emitter 503 also includes at least one of layers 571(3)-573(3), which are respective examples of layers 471(3)-473(3), FIG. 4. In embodiments, emitters 501-503 include respective layers 542(1-3), which are respective examples of layers 442(1-3), FIG. 4. In embodiments, emitters 502 and 503 include respective layers 551(1) and 551(2), which are respective examples of layers 451(1) and 451(2), FIG. 4.

Prior to fabricating emitter 501, substrate 505 is etched to form a recess 513 that has a depth 511 and a width 516. Emitter 501 is at least partially contained in recess 513, such that recess 513 lowers the profile or height of emitter 501, relative to a top surface 529 of hole blocking layer 520. Prior to fabricating emitter 502, the wafer or substrate is etched to from a recess 514, which has a depth 512 and a width 516. Emitter 502 is at least partially contained in recess 514, such that recess 514 lowers the profile of height of emitter 502 such that, relative to top surface 529, respective heights of emitters 501 and 502 are substantially equal, e.g., to within five percent. Prior to fabricating emitter 503, substrate 505 is also etched to form a recess 515, which has a depth 512 and a width 518. Emitter 503 is at least partially contained in recess 515. Relative to top surface 529, a height of emitter 503 exceeds that of emitters 501 and 502.

In embodiments, at least one of width 517 exceeds width 516, and depth 512 exceeds depth 511. In embodiments, width 518 exceeds width 517. In embodiments, recess depths 511 and 512 are equal.

As shown by this example, emitter 502 is a deeper than emitter 501 in substrate 505 so that by the time the epitaxial growth is finished, emitters 501 and 502 have roughly the same height above top surface 529. As such, respective top surfaces of emitters 501 and 502 are coplanar, thus facilitating subsequent processing such as planarization and transfer of the resulting emitters to other substrates. A second benefit is that for emitter 502, its p-type contact layer 572(2) and contact (ohmic) metal 573(2) do not touch the active QW region 543(2), so there is even less of a chance of exciting emission from QW region 543(2) in emitter 502. By contrast, in display device 400, p-type contact layer 472(2) of emitter 402 is adjacent to active QW region 443(2). To avoid unintentionally exciting light mission from QW region 443(2) in emitter 402, parts of p-type contact layer 472(2) are removed, e.g., etched away, such that no part of p-type contact layer 472(2) is adjacent to active QW region 443(2).

Figure 6:
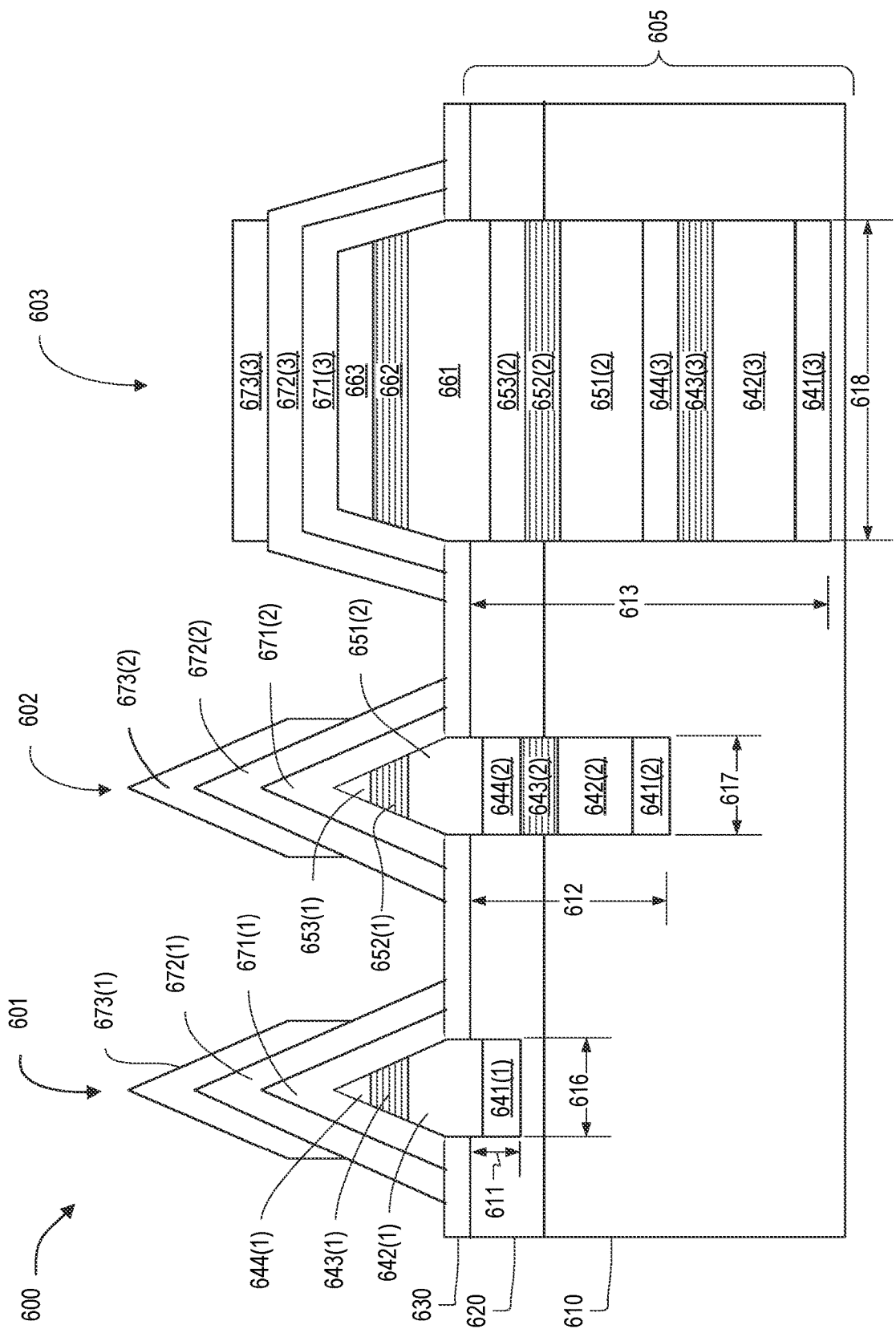
FIG. 6 illustrates an example of LED color selection by SAG opening depth, in accordance with aspects of this disclosure.

FIG. 6 is a cross-sectional schematic of a display device 600, which illustrates an example of LED color selection by SAG opening depth, in accordance with aspects of this disclosure. Display device 600 includes a substrate 605 and emitters 601 and 602 thereon. In embodiments, display device 600 also includes an emitter 603. Substrate 605 is an example of substrate 405, and includes a buffer layer 610 and, in embodiments, a hole blocking layer 620 thereon. Buffer layer 610 and hole blocking layer 620 are respective examples of buffer layer 410, and hole blocking layer 420. Emitters 601-603 are respective examples of emitters 401-403. FIG. 6 includes a SAG mask 630 on substrate 605. SAG mask 630 is an example of SAG mask 430, and may be used in a selective aperture etching process to fabricate display device 600.

Emitter 601 includes layers 641(1), 643(1), and 644(1), which are respective examples of layers 441(1), 443(1), and 444(1) of emitter 401. In embodiments, emitter 601 also includes at least one of layers 671(1)-673(1), which are respective examples of layers 471(1)-473(1), FIG. 4. Emitter 602 includes layers 641(2), 643(2), 644(2), 652(1), and 653(1) which are respective examples of layers 441(2), 443(2), 444(2), 452(1), and 453(1) of emitter 402. In embodiments, emitter 602 also includes at least one of layers 671(2)-673(2), which are respective examples of layers 471(2)-473(2), FIG. 4. Emitter 603 includes layers 641(3), 643(3), 644(3), 652(2), 653(2), 662, and 663, which are respective examples of layers 441(3), 443(3), 444(3), 452 (3), and 453(3), 462, and 463 of emitter 403. In embodiments, emitter 603 also includes at least one of layers 671(3)-673(3), which are respective examples of layers 471(3)-473(3), FIG. 4. In embodiments, emitters 601-503 include respective layers 642(1-3), which are respective examples of layers 442(1-3), FIG. 4. In embodiments, emitters 602 and 603 include respective layers 651(1) and 651(2), which are respective examples of layers 451(1) and 451(2), FIG. 4.

In this example, each of emitters 601-603 is grown by first etching a respective recess 613-615 into substrate 605, wherein respective depths 611-613 of the recess are different for each emitter 601-603 to provide co-planar structures. For example, emitter 601 is grown from an etch depth 611, that is less than an etch depth 612 used for emitter 602, which is less than an etch depth 613 for emitter 603. Hence, each of emitters 601-603 is grown from different respective depth within substrate 605 such that respective top surfaces of emitters 601-603 are coplanar. Hence, in each of emitters 601-603, p-type contact layers 672 is contact with or horizontally adjacent to only the upper-most active QW region of the emitter, that is, the active QW region closest to p-contact layer 672 in a vertical direction perpendicular to a top surface of substrate 605. Recesses 613-615 have respective widths 616-618. In embodiments, at least one of (i) width 618 exceeds width 617 and (ii) depth 613 exceeds depth 612.

Figure 7:
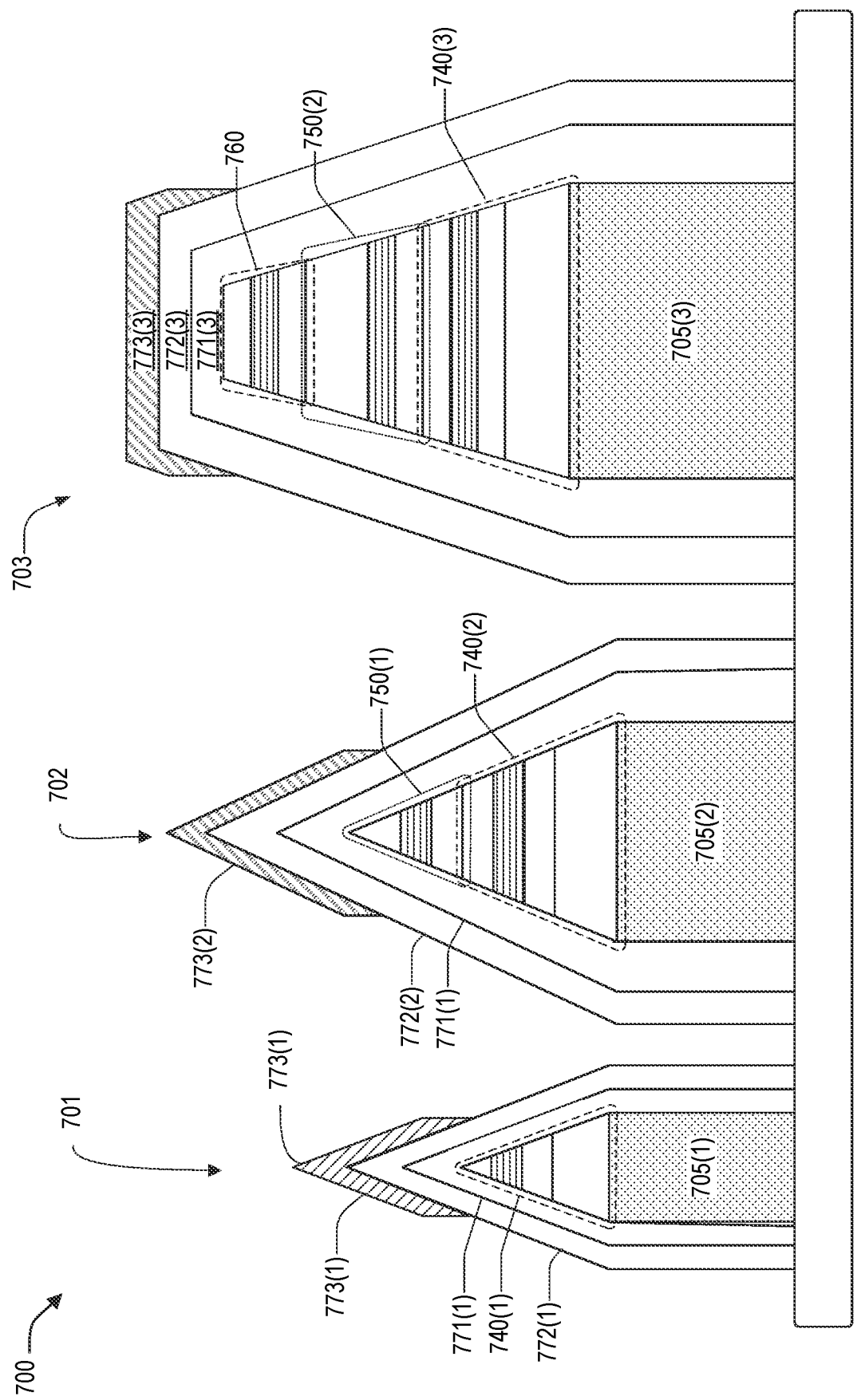
FIG. 7 illustrates an example of LED color selection by pedestal width, in accordance with aspects of this disclosure.

Additionally or alternatively, emitters described above can be grown on pedestals. This can still be done using a SAG mask, where there may be a need to grow pedestals to grow the buffer layer to improve crystal quality, for example. FIG. 7 is a cross-sectional schematic of a display device 700 that illustrates an example of LED color selection by pedestal width, in accordance with aspects of this disclosure. Display device 700 is an example of display device 400 and includes emitters 701,702, and in embodiments, an emitter 703 that are grown on separate pedestals. Emitters 701-703 are respective examples of emitters 401-403.

Emitter 701 includes a substrate 705(1) and a layer group 740(1), which are respective examples of substrate 405 layer group 440(1), FIG. 4. Emitter 702 includes a substrate 705(2) and layer groups 740(2) and 750(1), which are respective examples of substrate 405, layer groups 440(2) and 450(1), FIG. 4. Emitter 703 includes a substrate 705(3) and layer groups 740(3) and 750(2), and 760, which are respective examples of substrate 405 and layer groups 440(3) and 450(2), and 460, FIG. 4. In embodiments, emitters 701-703 include respective layers 771(1-3), 772(1-3), and 773(1-3) which are respective examples of layer groups 471(1-3), 472(1-3), and 473(1-3), FIG. 4.

Figure 8:
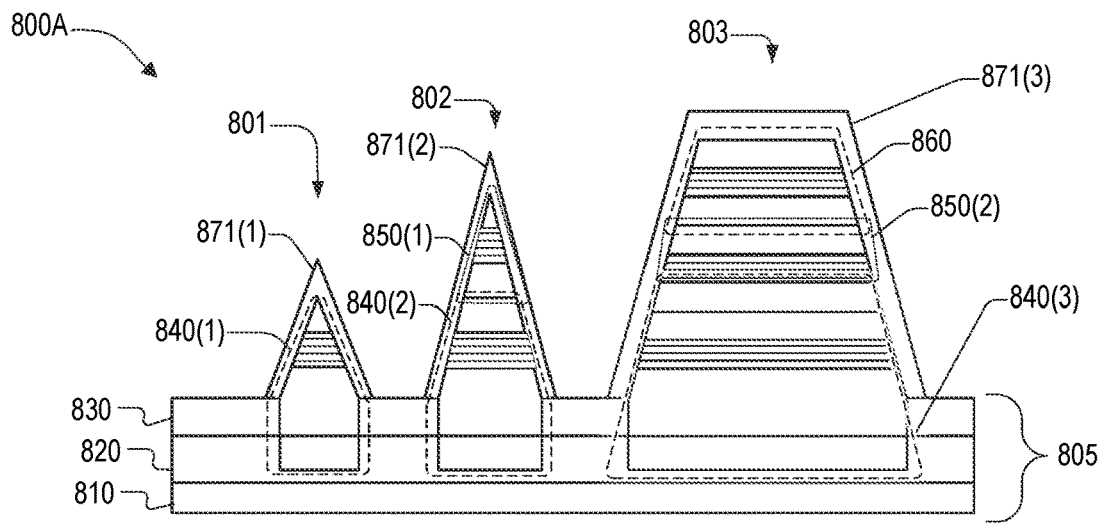
FIGS. 8-10 are respective cross-sectional schematics of a display devices, each of which is an example of the display device of FIG. 4.
Figure 8:
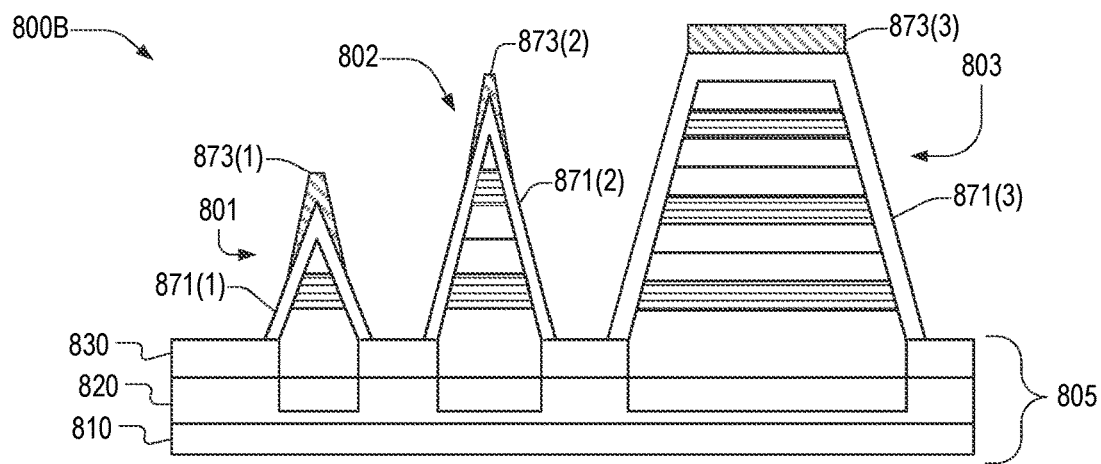
Figure 9:
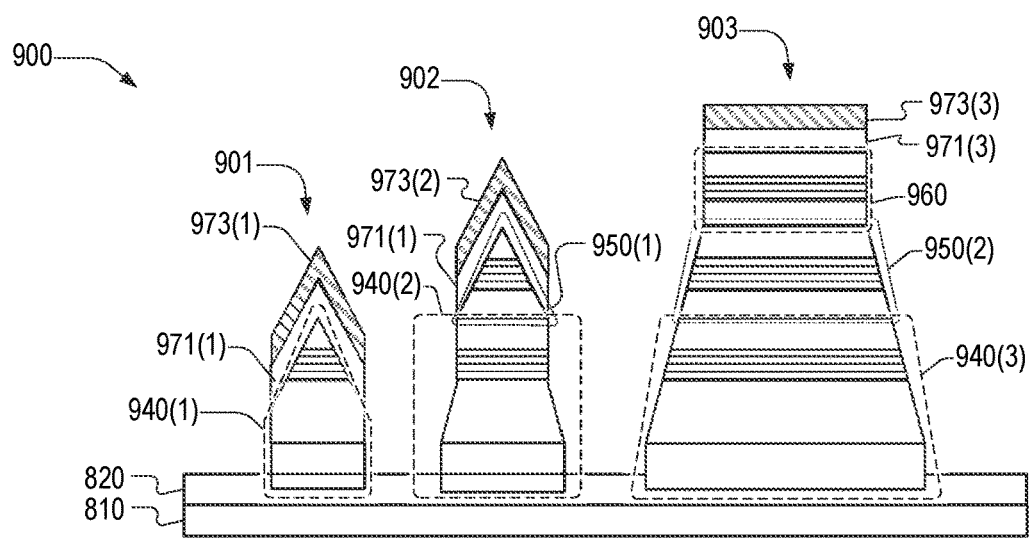

FIGS. 8 and 9 are cross-sectional schematics of display devices 800A, 800B, and 900, each of which are examples of display device 400. Display device 800A, 800B, and 900 illustrate an example of single continuous selective area growth with etch isolation, in accordance with aspects of this disclosure. This example may be achieved by using, for example, one epitaxial process and two masks (excluding metal layers), and where an emitter's light emission spectrum is determined by the width of apertures in a SAG mask. Each of display devices 800A, 800B, 900, and 1000 is an example of display device 400 in FIG. 4.

Display device 800A includes a substrate 805 and emitters 801,802, and in embodiments, an emitter 803 thereon. Substrate 805 includes a buffer layer 810 and, in embodiments, a hole blacking layer 820 thereon. Layers 810 and 820 are respective examples of layers 410 and 420. FIG. 8 includes a SAG mask 830 on substrate 805. SAG mask 830 is an example of SAG mask 430, and may be used in a selective aperture etching process to fabricate display devices 800A, 800B, and 900.

Emitter 801 includes a layer group 840(1) and an electron blocking layer 871(1), which are respective examples of layer group 440(1) and electron blocking layer 471(1), FIG. 4. Emitter 802 includes layer groups 840(2), 850(1) and an electron blocking layer 871(2), which are respective examples of layer groups 440(2), 450(1), and electron blocking layer 471(2), FIG. 4. Emitter 803 includes layer groups 840(3), 850(2), 860, and electron blocking layer 871(3) which are respective examples of layer groups 440(3), 450(2), 460, and electron blocking layer 471(3), FIG. 4.

The following description includes processing of an embodiment of display device 800A that yields display devices 800A and 900, in which the embodiment of display device 800A includes emitter 803. It should be understood that the similar processes applied to embodiments of display device 800A that lack emitter 803 result in analogous display devices 800B and 900 that accordingly lack emitter 803 emitters derived therefrom.

Display device 800B is display device 800A after deposition and, in embodiments, patterning of, ohmic contact layers 873(1-3) therein, which are respective examples of ohmic contact layers 473(1-3). Display device 900 is display device 800B after etching sidewalls of emitters 801-803 yield respective emitters 901-903.

Emitter 901 includes a layer group 940(1) an electron blocking layer 971(1), and ohmic contact layer 973(3), which are layer group 840(1), electron blocking layer 871(1), and ohmic contact layer 873(3) after said etching. Emitter 902 includes layer groups 940(2), 950(1) and an electron blocking layer 971(2), which are layer groups 840(2), 850(1) and an electron blocking layer 871(2) after said etching. Emitter 803 includes layer groups 940(3), 950(2), 960, and electron blocking layer 971(3), which are layer groups 840(3), 850(2), 860, and electron blocking layer 871(3) after said etching.

Figure 10:
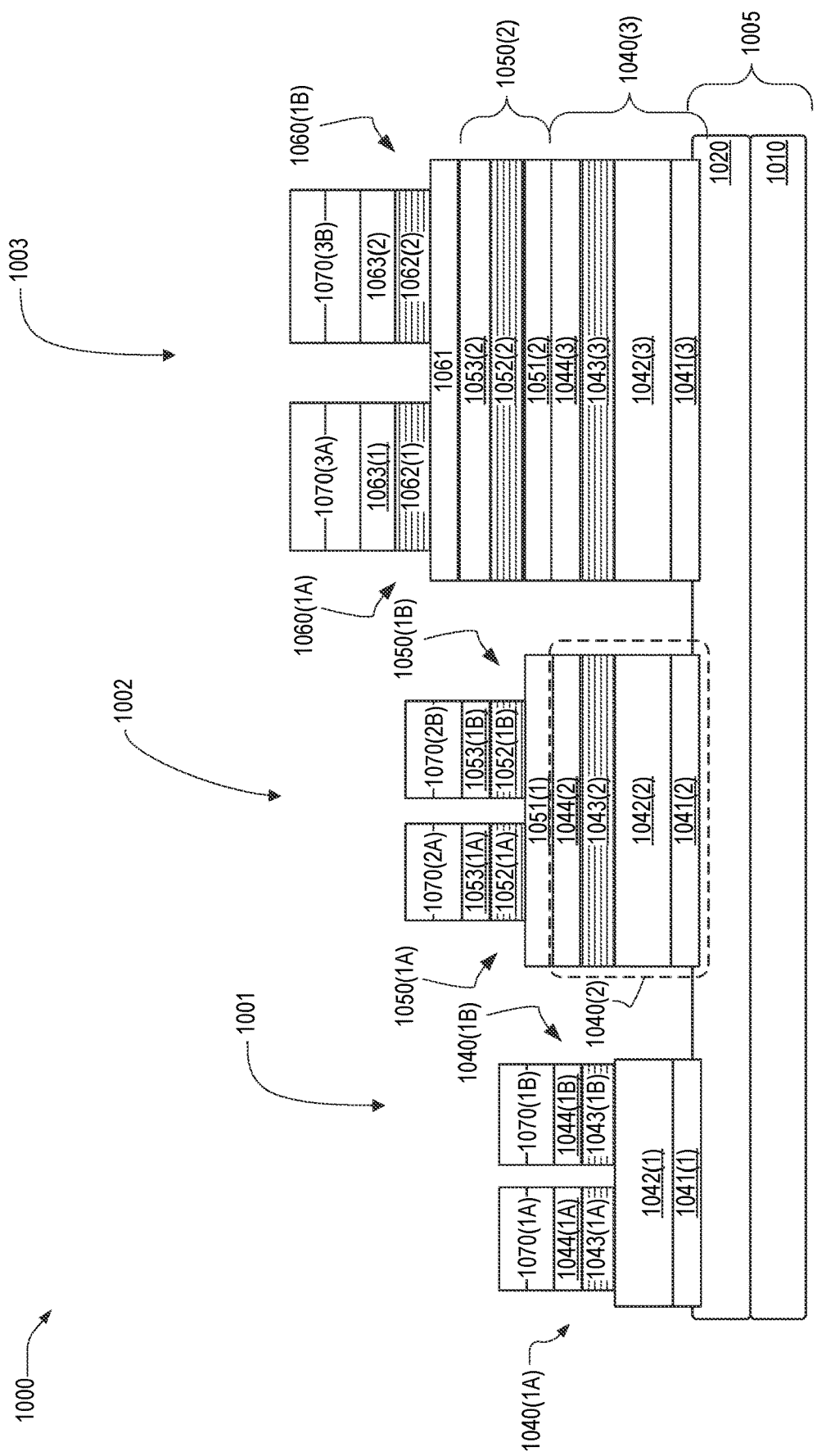

FIG. 10 is a cross-sectional schematic of a display device 1000, which is an example of display device 400. Display device 1000 includes a substrate 1005 and, on substrate 1005, dual emitters 1001 and 1002, and in embodiments, a dual emitter 1003. Emitters 1001-1003 are respective examples of emitters 401-403. Substrate 1005 is an example of substrate 405 and includes a buffer layer 1010 and, in embodiments, a hole blocking layer 1020.

Dual emitter 1001 includes two layer groups 1040(1A) and 1040(1B), each which is an example of layer group 440(1), FIG. 4. Layer groups 1040(1A) and 1040(1B) share a common layer 1041(1) and, in embodiments, a common layer 1042(1), which are respective examples of layer 441(1) and 442(1). Layer group 1040(1A) also includes active QW region 1043(1A) and layer 1044(1A), which are respective examples of active QW region 443(1) and layer 444(1). Layer group 1040(1B) also includes active QW region 1043(1B) and layer 1044(1B), which are respective examples of active QW region 443(1) and layer 444(1). Layer groups 1040(1A) and 1040(1B) can be independently controlled via respective layer groups 1070(1A) and 1070(1B) thereon, each of which are examples of layer groups 470(1), FIG. 4.

Dual emitter 1002 includes a layer group 1040(2), which is an example of layer group 440(2), FIG. 4. Dual emitter 1002 also includes two layer groups 1050(1A) and 1050(1B), each which is an example of layer group 450(1), FIG. 4. In embodiments, layer groups 1050(1A) and 1050(1B) share a common layer 1051(1), which is an example of layer 451(1). Layer group 1050(1A) also includes active QW region 1052(1A) and layer 1053(1A), which are respective examples of active QW region 452(1) and layer 453(1). Layer group 1050(1B) also includes active QW region 1052(1B) and layer 1053(1B), which are respective examples of active QW region 452(1) and layer 453(1).

Layer groups 1050(1A) and 1050(1B) can be independently controlled via respective layer groups 1070(2A) and 1070(2B) thereon, each of which are examples of layer groups 470(2), FIG. 4.

Dual emitter 1003 includes a layer group 1040(3) and a layer group 1050(2), which are respective examples of layer groups 440(3) and 450(2), FIG. 4. Dual emitter 1003 also includes two layer groups 1060(1) and 1060(2), each which is an example of layer group 460, FIG. 4. In embodiments, layer groups 1060(1) and 1060(2) share a common hole blocking layer 1061, which is an example of hole blocking layer 461, FIG. 4. Layer group 1060(1) also includes active QW region 1062(1) and layer 1063(1), which are respective examples of active QW region 462 and layer 463, FIG. 4. Layer group 1060(2) also includes active QW region 1062(2) and layer 1063(2), which are respective examples of active QW region 462 and layer 463. Layer groups 1060(1) and 1060(2) can be independently controlled via respective layer groups 1070(3A) and 1070(3B) thereon, each of which are examples of layer groups 470(3), FIG. 4.

In the case that the structure is formed using stripes or elongated structures that are subsequently etched to isolate individual devices, FIG. 10 illustrates isolation etch along the stripes to form individual LEDs of different colors. In this example, it can be seen that multiple different emitters 1001 are formed from etching a blue LED stripe, multiple different emitters 1002 devices are formed from etching a green LED stripe, and multiple different emitters 1003 devices are formed from etching a red LED stripe.

The etching may be used to remove the p-type contact layer to avoid any connection between the p-type contact layer and any of the quantum wells that may be grown below the top surface quantum well. Any overlap between the p-type contact layer and some of those quantum wells may have the potential of current passing through to excite the other quantum wells. By performing this type of etching it is possible to keep these undesired excitations from happening.

Figure 11:
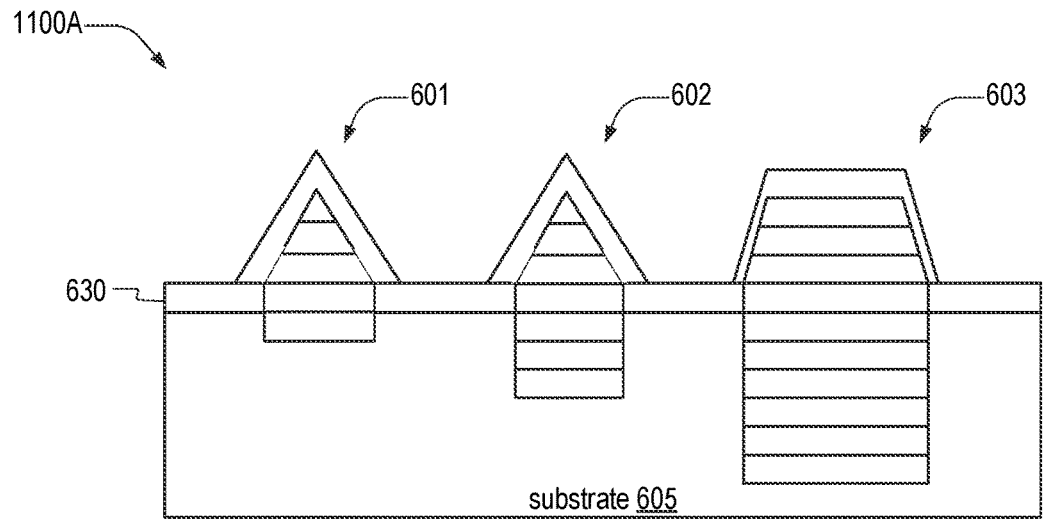
FIGS. 11 and 12 illustrate an example of single SAG with uniform height, in accordance with aspects of this disclosure.
Figure 11:
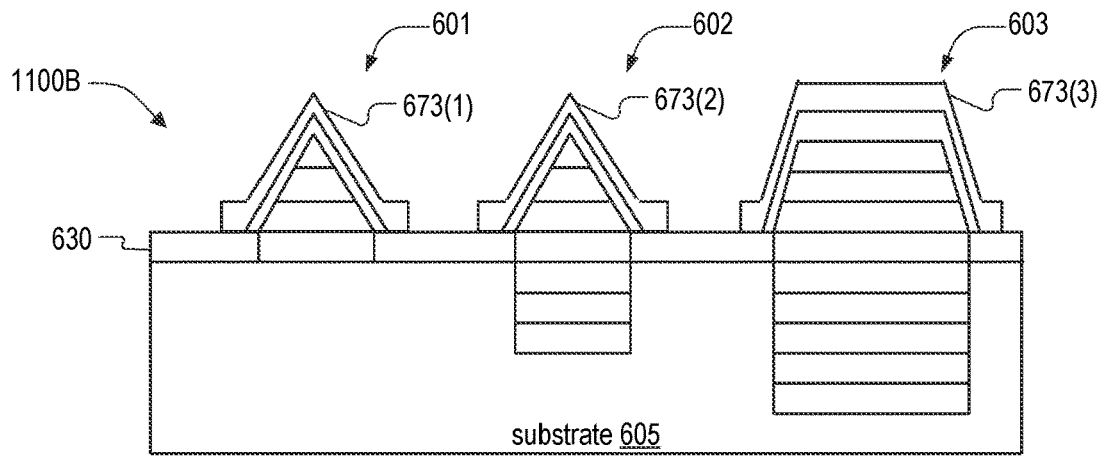
Figure 11:
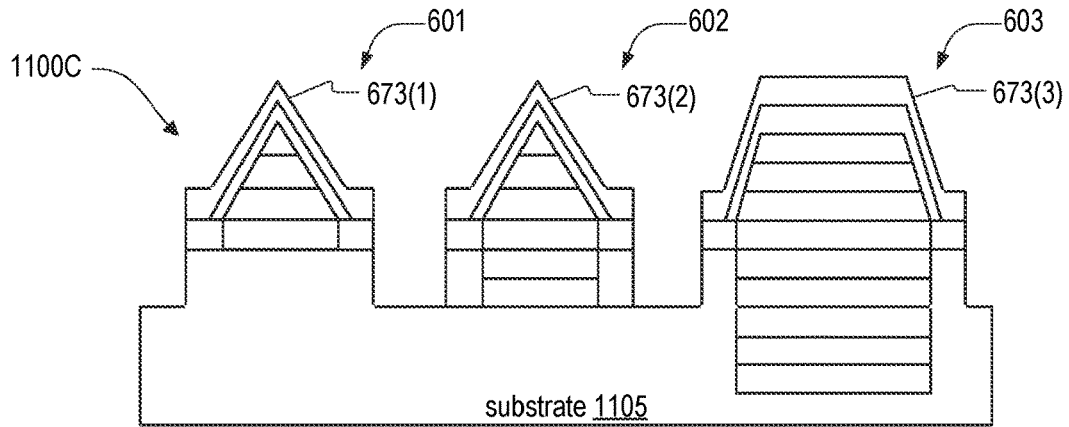
Figure 12:
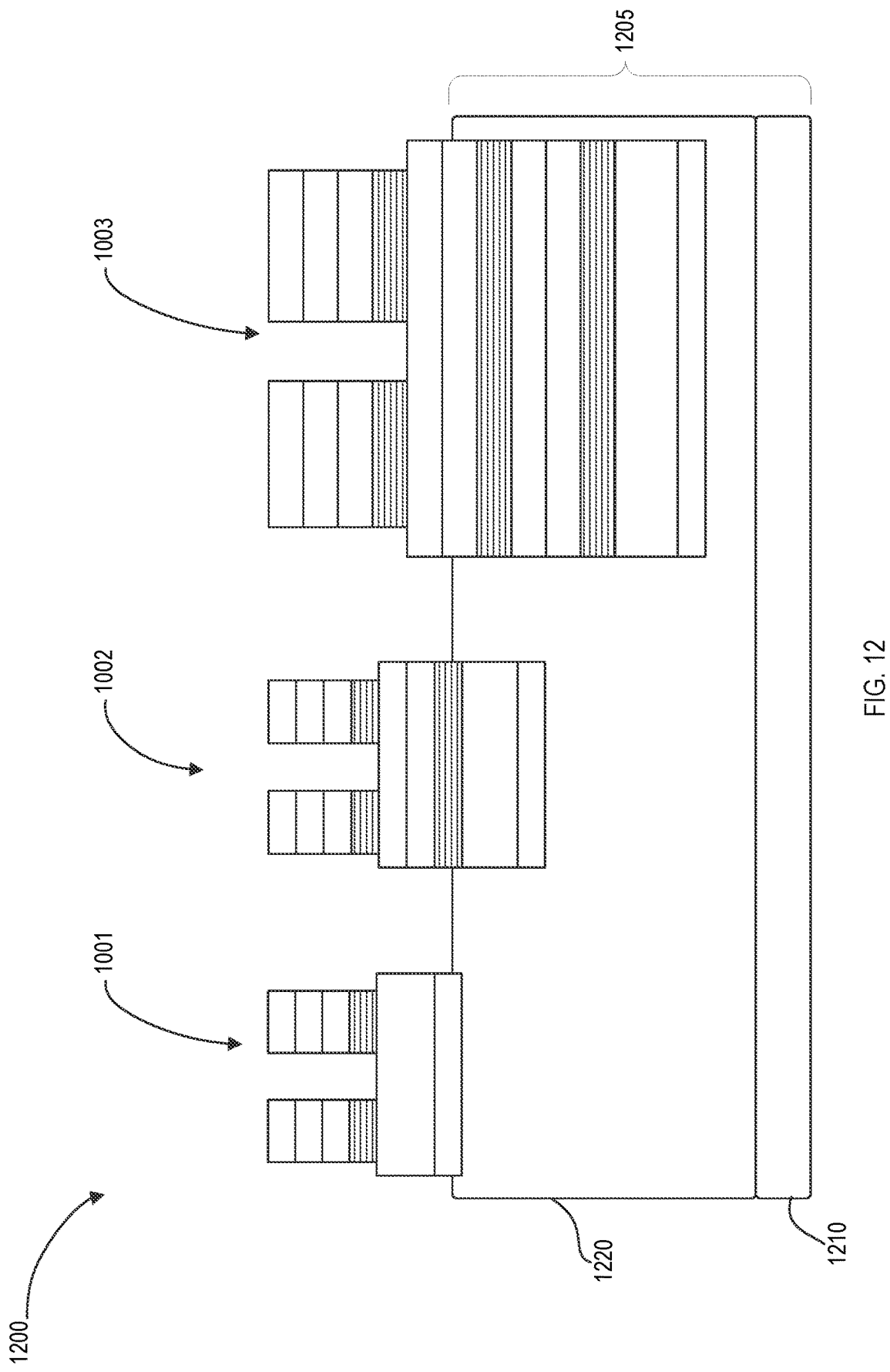

FIGS. 11 and 12 include cross-sectional schematics of display devices 1100A, 1100B, 1100C, and 1200 that illustrate an example of single selective area growth with uniform height, in accordance with aspects of this disclosure. This example may be achieved by using, for example, one epitaxial process and three or four masks (excluding metal layers), and where color is selected by SAG opening width and depth. Each of display devices 1100A, 1100B, 1100C, and 1200 is an example of display device 600, FIG. 6.

Display device 1100A illustrates the use of SAG for three different depths of recesses, resulting in three different emitters operating at three different ranges of the electromagnetic spectra. In the example of FIG. 11, the three different emitters are emitters 601-603 introduced in FIG. 6. Display device 1100B illustrates the metal deposition and patterning steps in the display device fabrication. Display device 1100C illustrates an isolation etch of substrate 605 used to separate the different devices or structures (if SAG mask is contiguous), which yields an etched substrate 1105.

In the case that the structure is formed using stripes or elongated structures that are subsequently etched to isolate individual devices, display device 1200 illustrates isolation etch along the stripes to form emitters 1001-1003, introduced in FIG. 10. Display device 1200 is an example of display device 1000 in which emitters 1001-1003 formed at different depths within substrate 1205. Substrate 1205 is an example of substrate 605, and includes at least of layers 1210 and 1220, which are respective examples of layers 610 and 620. In embodiments, multiple different emitters 1001 are formed from etching a blue LED stripe, multiple emitters 1002 are formed from etching a green LED stripe, and multiple different emitters 1003 are formed from etching a red LED stripe.

As this example illustrates, one or more techniques can be used together. For example, it is possible to etch at different depths, to etch only the contact metal, to etch into the semiconductor substrate, or some combination of these.

Figure 13:
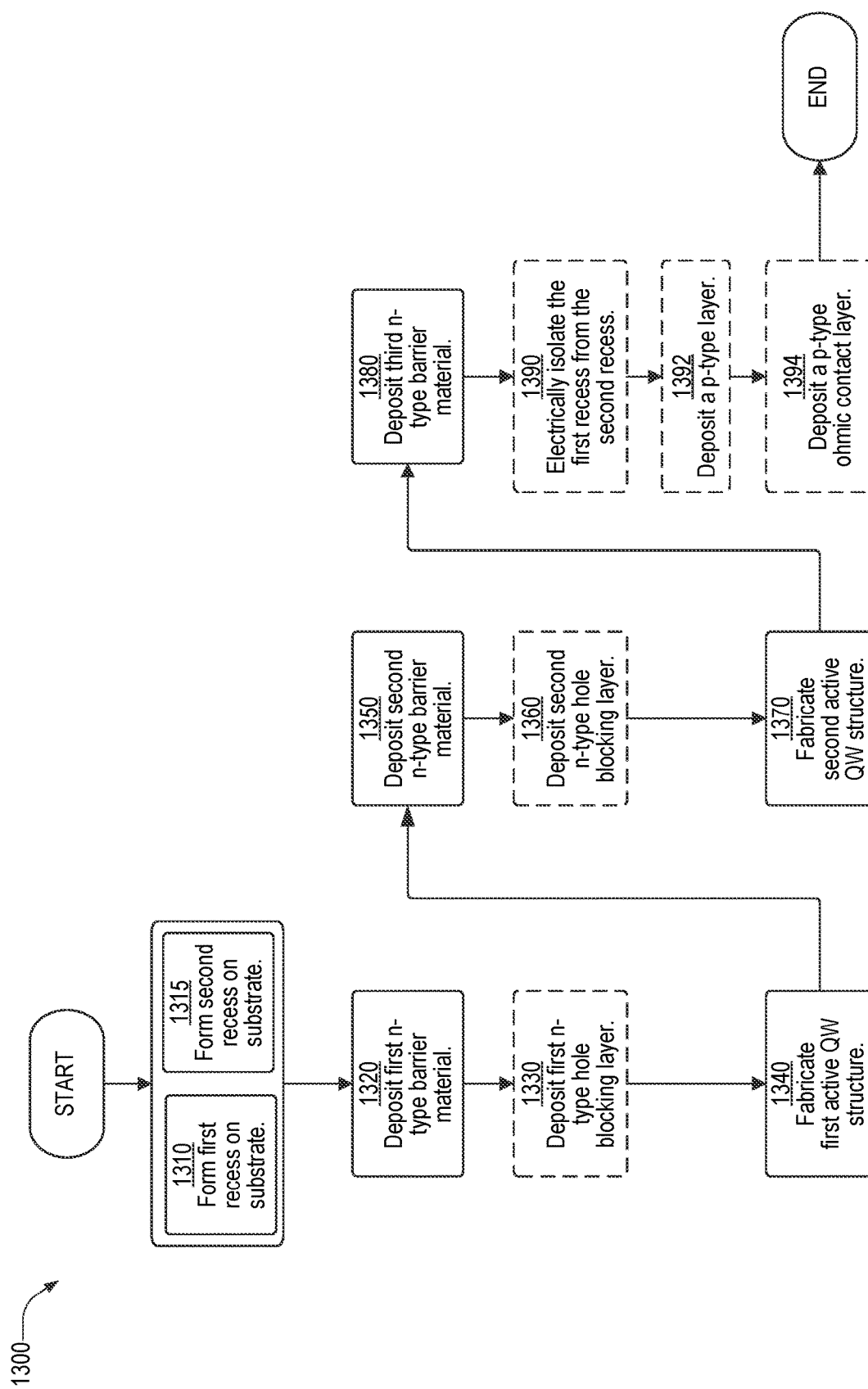
FIG. 13 is a flowchart illustrating a method for forming a plurality of light emitters, in accordance with aspects of the present disclosure.

FIG. 13 is a flowchart illustrating a method 1300 for forming a plurality of light emitters supported on a substrate. Method 1300 may be implemented to form any of display devices of FIGS. 1-12. Method 1300 includes steps 1310, 1315, 1320, 1340, 1350, 1370, and 1380. In embodiments, method 1300 also includes at least one of steps 1330, 1360, 1390, 1392, and 1394. In embodiments, each step of method 1300 is executed in a single epitaxial growth pass.

Step 1310 includes forming a first recess on the substrate, the first recess having a first width and a first depth. In an example of step 1310, recess 513 is formed in substrate 505, FIG. 5. Step 1315 includes forming a second recess on the substrate. The second recess has a second width and a second depth, at least one of the second width and the second depth is larger than the first width and first depth, respectively. In an example of step 1310, recess 514 is formed in substrate 505.

Step 1320 includes depositing a first n-type barrier material on the substrate. In example of step 1320, an n-type barrier layers 541(1) and 541(2) are deposited on substrate 505.

Step 1330 includes depositing a first n-type hole blocking layer (HBL) on the first n-type barrier material. In an example of step 1330, hole blocking layers 542(1) and 542(2) are deposited on layers 541(1) and 541(2), respectively.

Step 1340 includes fabricating a first active quantum well (QW) structure on the first n-type barrier material. In an example of step 1340, active QE regions 543(1) and 543(2) are fabricated either (i) on barrier layers 541(1) and 541(2) respectively or (ii) on hole blocking layers 542(1) and 542(2) respectively.

Step 1350 includes depositing a second n-type barrier material on the first active QW structure. In an example of step 1350, an n-type barrier layers 544(1) and 544(2) are deposited on active QE regions 543(1) and 543(2) respectively.

Step 1360 includes depositing a second n-type HBL on the second n-type barrier material. In an example of step 1360, hole blocking layer 551(1) is deposited on barrier layer 544(2).

Step 1370 includes fabricating a second active QW structure on the second n-type barrier material. In an example of step 1370, active QE region 552(1) is fabricated either on barrier layer 544(2) or on hole blocking layer 551(1).

Step 1380 includes depositing a third n-type barrier material on the second active QW structure. In an example of step 1380, n-type barrier layer 553(1) is deposited on active QE region 552(1).

As a result of steps 1310, 1315, 1320, 1340, 1350, and 1370, the first width and first depth of the first recess are configured to prevent formation of the second active QW structure within the first recess such that the first n-type barrier material, the first active QW structure, and the second n-type barrier layer form a first light emitter. Examples of the first light emitter include emitters 401, 501, 601, 701, 801, 901, and 1001.

As a result of steps 1310, 1315, 1320, 1340, 1350, and 1370, the second width and second depth of the second recess are configured for supporting the first n-type barrier material, the first active QW structure, the second n-type barrier material, the second active QW structure, and the third n-type barrier material within, and at least partially contained within, the second recess. to form a second light emitter. Examples of the second light emitter include emitters 402, 502, 602, 702, 802, 902, and 1002.

Step 1390 includes electrically isolating the first recess from the second recess such that the first recess supports the first emitter, while the second recess supports the second emitter, such that the first emitter is electrically isolated from the second emitter. As in example of step 1390, parts of substrate 605 between emitters 601, 602, and 603 of display device 1100B are removed, e.g., wet or dry etched, to yield display device 1100C.

Step 1392 includes depositing a p-type layer on each one of the first and second LED structures. In an example of step 1392, p-type layers 572(1) and 572(2) are deposited on emitters 501 and 502, respectively.

Step 1394 includes forming a p-type ohmic contact on each one of the first and second LED structures. In an example of step 1394, ohmic contact layers 573(1) and 573(2) are deposited on emitters 501 and 502, respectively.

It is to be understood that the examples described herein are provided by way of illustration and not of limitation. The order of the quantum wells can be different than the one shown in the figures, there may be more or less than the three quantum wells shown in the figures, the quantum wells may be of different colors than the ones shown in the figures, and additional layers than those shown in the figures may be included that may improve different aspects of the performance of the LEDs. In some implementations, it may be helpful to have the blue LED be small since blue light provides a small component of the light produced by a display and the blue LED is quite efficient. In such implementations, the green LED is also efficient and can be of similar size as the blue LED or perhaps slightly larger. In such implementation, the red LED is not as efficient as the blue LED or the green LED and may need to be the largest device.

Additional considerations to the examples described above in connection with FIGS. 1-6B include top contact placement, number of epitaxial process passes (e.g., epitaxial passes), the overall selection of color for an LED based on width, depth, or a combination of width and depth, and different ways to isolate devices or structures (e.g., individual LEDs of different colors).

Device isolation can be achieved by isolating individual devices using the openings in the SAG mask (e.g., an array of openings defines the position and isolation of an array of corresponding LED devices. In other words, each device or structure is a two-dimensionally isolated feature in the SAG mask by using small openings and each opening is used to grow the structure of an LED.

It is also possible to use a stripe (e.g., elongated feature) SAG and then apply an isolation etch to isolate individual devices made from a stripe structure (see e.g., FIGS. 5B and 9). For example, the devices are grown in stripes and are then etched in a direction perpendicular to the stripes to isolate the devices. It may be possible to have a stripe with different widths along its length and the etching is such that it isolates LEDs of different colors from the same stripe.

The type of device isolation used, whether isolated SAG or stripe SAG with isolation etch, may affect device passivation and packing density.

With respect to the top contact plane, it could be the c-plane or a non-c-plane. The c-plane is the top plane, the flat plane. In some cases the contact is on the c-plane and in others is on the non-c-plane, the slanted plane. The selection of the top contact plane may affect the relative intensity of the different colors.

With respect to the number of epitaxial process passes (e.g., epitaxial passes), the examples described above correspond to a single epitaxial pass that provides for light emitters operating at different ranges of the electromagnetic spectra (e.g., the epitaxial growth process in the single pass will produce quantum wells that can generate three colors of light, such as red, green, and blue). Other implementations may be such that the fabrication method so implemented produces more than three colors for each epitaxial pass. Yet other implementations may produce two colors for each epitaxial pass instead of three colors for each epitaxial pass. In yet other implementations, one epitaxial pass may produce one color and another epitaxial pass may produce two colors for a total of three colors. In such implementation, the first epitaxial pass may produce one or two colors and the second epitaxial pass may produce the other color or colors. In yet another implementation, two epitaxial passes may be used, where each epitaxial pass produces two colors for a total of four colors. A four-color solution may be used to provide better gamut and power efficiency. When more than one epitaxial pass is used, some form of masking may be applied to cover those areas where an epitaxial pass is not supposed to be applied.

With respect to color selectivity, using width determines when the epi terminates itself. The use of depth control the color makes the process more complex because of the etching, but can end up with better planarity and color separation. The overall selection of color by width, depth, or a combination of the two, as described in detail above, can affect the planarity of the devices and the process complexity.

In general, the present disclosure describes various techniques and devices that enable monolithically integrating light emitting structures that generate different colors of light on a same substrate.

Combinations of Features (A1) A display device includes a substrate including a first emitter and a second emitter thereon. The first emitter includes a first lower active quantum well (QW) region that has a first emission spectrum spanning a first spectral range. The second emitter includes (i) an upper active QW region that has a second emission spectrum spanning a second spectral range that is distinct from the first spectral range, (ii) a second lower active QW region having the first emission spectrum and being located between the upper active QW region and the substrate, and (iii) a barrier layer between the second lower active QW region and the upper active QW region for suppressing emission of the second lower active QW region.

(A2) In embodiments of display device (A1), each of the first and second lower active QW regions is characterized by a first set of lattice parameters. The upper active QW region is characterized by a second set of lattice parameters that differ from a respective parameter of the first set of lattice parameters by less than five percent.

(A3) Embodiments of display device (A2) further include a hole blocking layer between the second lower active QW region between and the upper active QW region.

(A4) In embodiments of display device (A3), the hole blocking layer including an n-type semiconductor material, (A5) In embodiments of any one of display devices (A1)-(A4), the barrier layer including an n-type semiconductor material.

(A6) In embodiments of any one of display devices (A1)-(A5), the first emitter has a first height with respect to a top surface of the substrate. The substrate defines a recess that extends into the substrate. The second emitter is at least partially contained within in the recess such that a height of the second emitter with respect to the top surface equals the first height.

(A7) In embodiments of display device (A6), a depth of the recess with respect to the top surface is substantially equal to the first height.

(A8) In embodiments of either one of display devices (A6) and (A7), the substrate defines an additional recess that extends into the substrate, the first emitter being at least partially contained within the additional recess.

(A9) In embodiments of any one of display devices (A1)-(A8), the second emitter being adjacent to the first emitter in a first direction parallel to a top surface of the substrate, and at least one of: (i) a width of the second lower active QW region exceeding a width of the first lower active QW region in the first direction; and (ii) a cross-sectional area of the second lower active QW region in a plane parallel to the top surface exceeding a cross-sectional area of the first lower active QW region.

(A10) Embodiments of any one of display devices (A1)-(A9) further include (i) a plurality of additional first emitters that, with the first emitter, form an array of first emitters; and (ii) a plurality of additional second emitters that, with the second emitter, form an array of second emitters that is interleaved with the array of first emitters.

(A11) In embodiments of any one of display devices (A1)-(A10) the first emitter and the second emitter include at least one of (i) a respective p-doped semiconductor layer and (ii) a respective ohmic contact layer.

(B1) A method for forming a plurality of light emitters includes (i) forming a first recess on a substrate, the first recess having a first width and a first depth; (ii) forming a second recess on the substrate, the second recess having a second width and a second depth, at least one of the second width and the second depth being larger than the first width and first depth, respectively; (iii) depositing a first n-type barrier material on the substrate; (iv) fabricating a first active quantum well (QW) structure on the first n-type barrier material; (v) depositing a second n-type barrier material on the first active QW structure; (vi) fabricating a second active QW structure on the second n-type barrier material; and (vii) depositing a third n-type barrier material on the second active QW structure. The first width and first depth of the first recess are configured to prevent formation of the second active QW structure within the first recess such that the first n-type barrier material, the first active QW structure, and the second n-type barrier layer form a first light emitter. The second width and second depth of the second recess are configured for supporting the first n-type barrier material, the first active QW structure, the second n-type barrier material, the second active QW structure, and the third n-type barrier material within, and at least partially contained within, the second recess to form a second light emitter.

(B2) Embodiments of method (B1) further include, after depositing the first n-type barrier material and prior to fabricating the first active QW structure: depositing a first n-type hole blocking layer (HBL) on the first n-type barrier material.

(B3) Embodiments of either one of methods (B1) and (B2) further include, after depositing the second n-type barrier material and prior to fabricating the second active QW structure: depositing a n-type hole blocking layer (HBL) on the second n-type barrier material.

(B4) Embodiments of any one of methods (B1)-(B3) further include electrically isolating the first recess from the second recess such that the first recess supports the first emitter, while the second recess supports the second emitter, such that the first emitter being electrically isolated from the second emitter.

(B5) Embodiments of method (B4) further include at least one of (i) depositing a p-type layer on each one of the first and second LED structures, and (ii) forming a p-type ohmic contact on each one of the first and second LED structures.

(B6) In embodiments of any one of methods (B1)-(B5), each step of depositing and fabricating is executed in a single epitaxial growth pass.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A display device comprising:
a substrate including a first emitter and a second emitter thereon,
the first emitter including a first lower active quantum well (QW) region that has a first emission spectrum spanning a first spectral range, and
the second emitter including (i) an upper active QW region that has a second emission spectrum spanning a second spectral range that is distinct from the first spectral range, (ii) a second lower active QW region having the first emission spectrum and being located between the upper active QW region and the substrate, and (iii) a barrier layer between the second lower active QW region and the upper active QW region for suppressing emission of the second lower active QW region, an area of the first emitter decreasing as a height of the first emitter, relative to a top surface of the substrate, increases.

2. The display device of claim 1, wherein each of the first lower active QW region and the second lower active QW region is characterized by a first set of lattice parameters, the upper active QW region being characterized by a second set of lattice parameters that differ from a respective parameter of the first set of lattice parameters by less than five percent.

3. The display device of claim 2, further comprising a hole blocking layer disposed between the second lower active QW region and the upper active QW region.

4. The display device of claim 3, wherein the hole blocking layer includes an n-type semiconductor material.

5. The display device of claim 1, wherein the barrier layer includes an n-type semiconductor material.

6. The display device of claim 1, wherein:
the first emitter has a first height with respect to the top surface of the substrate; and
the substrate has a recess that extends into the substrate, the second emitter being at least partially contained within the recess such that a height of the second emitter with respect to the top surface equals the first height.

7. The display device of claim 6, wherein a depth of the recess with respect to the top surface is substantially equal to the first height.

8. The display device of claim 6, wherein the substrate has an additional recess that extends into the substrate, the first emitter being at least partially contained within the additional recess.

9. The display device of claim 1, wherein the second emitter is adjacent to the first emitter in a first direction parallel to a top surface of the substrate, and at least one of:
a width of the second lower active QW region exceeds a width of the first lower active QW region in the first direction; or
a cross-sectional area of the second lower active QW region in a plane parallel to the top surface exceeding a cross-sectional area of the first lower active QW region.

10. The display device of claim 1, further comprising:
a plurality of additional first emitters that, with the first emitter, form an array of first emitters; and
a plurality of additional second emitters that, with the second emitter, form an array of second emitters that is interleaved with the array of first emitters.

11. The display device of claim 1, wherein the first emitter and the second emitter include at least one of (i) a respective p-doped semiconductor layer, or (ii) a respective ohmic contact layer.

12. The display device of claim 1, wherein an area of the second emitter decreases as a height of the second emitter, relative to the top surface of the substrate, increases.

13. A display device comprising:
a substrate including a first emitter and a second emitter thereon,
the first emitter including a first lower active quantum well (QW) region that has a first emission spectrum spanning a first spectral range,
the second emitter including (i) an upper active QW region that has a second emission spectrum spanning a second spectral range that is distinct from the first spectral range, (ii) a second lower active QW region having the first emission spectrum and being located between the upper active QW region and the substrate, and (iii) a barrier layer between the second lower active QW region and the upper active QW region for suppressing emission of the second lower active QW region,
the first emitter having a first height with respect to a top surface of the substrate,
the substrate defining a recess that extends into the substrate, the second emitter being partially contained within the recess and partially outside the recess, such that a second height of the second emitter with respect to the top surface equals the first height, and
an overall height of the second emitter is greater than an overall height of the first emitter.

14. The display device of claim 13, wherein a depth of the recess with respect to the top surface is substantially equal to the first height.

15. The display device of claim 13, the substrate defining an additional recess that extends into the substrate, the first emitter being at least partially contained within the additional recess.

16. The display device of claim 13, wherein the second emitter is adjacent to the first emitter in a first direction parallel to the top surface of the substrate, and at least one of:
a width of the second lower active QW region exceeds a width of the first lower active QW region in the first direction; or
a cross-sectional area of the second lower active QW region in a plane parallel to the top surface exceeds a cross-sectional area of the first lower active QW region.

17. A display device comprising:
a substrate including a first emitter and a second emitter disposed thereon, the second emitter being adjacent to the first emitter in a direction parallel to a top surface of the substrate;
the first emitter including a first lower active quantum well (QW) region having a first emission spectrum with a first spectral range,
the second emitter including:
an upper active QW region having a second emission spectrum with a second spectral range distinct from the first spectral range;
a second lower active QW region having the first emission spectrum and being disposed between the upper active QW region and the substrate; and
a barrier layer disposed between the second lower active QW region and the upper active QW region, the barrier layer suppressing emission from the second lower active QW region, and
at least one of:
a width of the second lower active QW region exceeding a width of the first lower active QW region in the direction parallel to the top surface of the substrate; or
a cross-sectional area of the second lower active QW region in a plane parallel to the top surface of the substrate exceeding a cross-sectional area of the first lower active QW region.

18. The display device of claim 17, wherein:
each of the first lower active QW region and the second lower active QW region has a first set of lattice parameters; and
the upper active QW region has a second set of lattice parameters that differ from a respective parameter of the first set of lattice parameters by less than five percent.

19. The display device of claim 18, further comprising a hole blocking layer disposed between the second lower active QW region and the upper active QW region.

20. The display device of claim 19, wherein the hole blocking layer includes an n-type semiconductor material.

21. The display device of claim 17, wherein the barrier layer includes an n-type semiconductor material.

22. The display device of claim 17, wherein:
the first emitter has a first height with respect to a top surface of the substrate; and
the substrate includes a recess that extends into the substrate, the second emitter being at least partially contained within the recess, such that a height of the second emitter with respect to the top surface of the substrate equals the first height.

23. The display device of claim 17, further comprising:
a plurality of additional first emitters that, with the first emitter, form an array of first emitters; and
a plurality of additional second emitters that, with the second emitter, form an array of second emitters that is interleaved with the array of first emitters.

24. The display device of claim 17, wherein the first emitter and the second emitter include at least one of a respective p-doped semiconductor layer, or a respective ohmic contact layer.

* * * * *